(12) United States Patent
Rao et al.

(10) Patent No.: US 7,652,513 B2
(45) Date of Patent: Jan. 26, 2010

(54) SLAVE LATCH CONTROLLED RETENTION FLOP WITH LOWER LEAKAGE AND HIGHER PERFORMANCE

(75) Inventors: Bindu Prabhakar Rao, Bangalore (IN); Sumanth Katte Gururajarao, Dallas, TX (US); Dharin N. Shah, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 11/895,853

(22) Filed: Aug. 27, 2007

(65) Prior Publication Data
US 2009/0058484 A1 Mar. 5, 2009

(51) Int. Cl.
*H03K 3/356* (2006.01)
(52) U.S. Cl. .................. 327/203; 327/211; 327/215; 327/218
(58) Field of Classification Search ............ 327/202, 327/203, 208, 210–212, 214, 215, 218
See application file for complete search history.

(56) References Cited

U.S. PATENT DOCUMENTS

| 6,762,638 B2 * | 7/2004 | Correale et al. ............ 327/202 |
| 6,788,122 B2 * | 9/2004 | Jones, Jr. .................... 327/202 |
| 7,091,766 B2 * | 8/2006 | Ko et al. ..................... 327/218 |

* cited by examiner

*Primary Examiner*—Lincoln Donovan
*Assistant Examiner*—William Hernandez
(74) *Attorney, Agent, or Firm*—Dawn V. Stephens; Wade James Brady, III; Frederick J. Telecky, Jr.

(57) ABSTRACT

In a method and apparatus for data retention, a first latch latches a data input and a second latch that is coupled to the first latch retains the data input while the first latch is inoperative in a standby power mode. The second latch includes a second latch inverter having an inverter input and an inverter output. A switching circuit, which may be implemented as a tristate inverter, is coupled to the inverter output, the inverter input, and a retention signal. The switching circuit is operable in the standby power mode to assert a logic state at the inverter input responsive to the retention signal. The logic state is in accordance with the data input retained in the standby power mode. A standby power source is operable to provide power in the standby power mode to the second latch inverter, the switching circuit and the retention input.

20 Claims, 9 Drawing Sheets

610

|  | CLK LOW | CLK FREE |
|---|---|---|
| RED. LEAK. TYPE DATA RET. CCT. 500 | 50 | 56 |
| HIGH PERF. TYPE DATA RET. CCT. 400 | 45 | 53 |
| APPARATUS 100 | 48 | 52 |

| CLK LOW RET. FLOP | CLK->Q(0) | TSU (0) | CLK->Q(1) | TSU (1) | BHT(ps) | COMMENTS |
|---|---|---|---|---|---|---|
| RED. LEAK. TYPE DATA RET. CCT. 500 | 130.99 | 129.639 | 139.8 | 129.639 | 269.629 |  |
| HIGH PERF. TYPE DATA RET. CCT. 400 | 141.8 | 95.5 | 152.5 | 85.7 | 248 |  |
| APPARATUS 100 | 145.4 | 98.5 | 148.5 | 95.5 | 247 | SIMILAR SIZING TO CLK GATING CMOS TYPE |

*FIG. 6B*

| TEMP(IN C) | CLK LOW RET FLOP | LEAKAGE (VDDC OR VRET) DIRECTION 0(nA) | LEAKAGE (VDDC OR VRET) DIRECTION 1 | AVG LEAKAGE(nA) | RELATIVE COMPARISON |
|---|---|---|---|---|---|
| 30 | RED. LEAK. TYPE DATA RET. CCT. 500 | 0.177 | 0.214 | 0.195 | 1.196X |
| 30 | HIGH PERF. TYPE DATA RET. CCT. 400 | 0.807 | 0.672 | 0.740 | 4.54X |
| 30 | APPARATUS 100 | 0.169 | 0.156 | 0.163 | 1X |
| 85 | RED. LEAK. TYPE DATA RET. CCT. 500 | 1.315 | 1.356 | 1.335 | 1.268X |
| 85 | HIGH PERF. TYPE DATA RET. CCT. 400 | 4.95 | 4.81 | 4.88 | 4.634X |
| 85 | APPARATUS 100 | 1.1 | 1.006 | 1.053 | 1X |
| 105 | RED. LEAK. TYPE DATA RET. CCT. 500 | 2.73 | 2.77 | 2.75 | 1.273X |
| 105 | HIGH PERF. TYPE DATA RET. CCT. 400 | 9.303 | 9.153 | 9.231 | 4.274X |
| 105 | APPARATUS 100 | 2.278 | 2.041 | 2.160 | 1X |

SLAVE LATCH CONTROLLED RETENTION FLOP WITH LOWER LEAKAGE AND HIGHER PERFORMANCE

BACKGROUND

The present invention is related in general to integrated circuits (ICs), and more particularly to an apparatus and method for providing data retention with reduced power consumption.

Many portable electronic devices such as cellular phones, digital cameras/camcorders, personal entertainment devices, laptop or palmtop computers, and video games operate on batteries. During periods of inactivity the device may not perform processing operations and may be placed in a power-down or standby power mode to conserve power. Power provided to ICs within the electronic device may be turned off in a standby power mode. Data retention circuits such as flip flops or latches within the device may be used to store status information for later use prior to the device entering the standby power mode. The data retention latch, which may also be referred to as a shadow latch or a balloon latch, is typically powered by a separate 'always on' power supply. However, presence of leakage current during the standby power mode represents a challenge for designing portable devices having an extended battery life.

Some data retention circuits may provide improved performance, some others may provide reduced silicon area, and few may provide a reduced leakage current. However, improvement in one parameter is often achieved at the cost of others, e.g., improvement in performance may be achieved at the cost of an undesirable increase in leakage current or silicon area or both, or an improvement in leakage current may make circuit inoperable or become less robust at lower voltages of a power source.

SUMMARY

Applicants recognize an existing need to provide an improved method and apparatus for providing data retention having reduced leakage current in a standby power mode, the reduced leakage current being achieved while attaining desired performance and desired silicon area, absent the disadvantages found in the prior art techniques discussed above. Applicants also recognize an existing need for the improved data retention apparatus and method to be free from gating of the clock path in the retention flip flop.

The foregoing need is addressed by the teachings of the present disclosure, which relates to an apparatus and method for data retention. According to one embodiment, in a method and apparatus for data retention, a first latch latches a data input and a second latch that is coupled to the first latch retains the data input while the first latch is inoperative in a standby power mode. The second latch includes a second latch inverter having an inverter input and an inverter output. A switching circuit, which may be implemented as a tristate inverter, is coupled to the inverter output, the inverter input, and a retention signal. The switching circuit is operable in the standby power mode to assert a logic state at the inverter input responsive to the retention signal. The logic state is in accordance with the data input retained in the standby power mode. A standby power source is operable to provide power in the standby power mode to the second latch inverter, the switching circuit, and the retention input.

In one aspect of the disclosure, a method for data retention in a standby power mode includes receiving a data input at a first latch of the data retention circuit. The data input is transferred from the first latch to a second latch under control of the clock. A retention input is asserted, e.g., logic high level, to cause the data retention circuit to operate in a standby power mode, thereby enabling retention of the data input in the second latch during the standby power mode. The first latch becomes inoperative in the standby power mode. Two cross coupled inverters of the second latch are powered in the standby power mode to retain the data input, one of the inverters being controlled by the retention input. Power to the first latch is restored prior to de-asserting the retention input. The retained data input is transferred to the output of the data retention circuit and the retention input is de-asserted to exit the power saving mode.

Several advantages are achieved by the method and system according to the illustrative embodiments presented herein. The embodiments advantageously provide an improved apparatus and method for data retention in a standby power mode. The improved apparatus and method for data retention advantageously provides a lower leakage current while providing desirable performance and desirable reduction in silicon area, especially when compared to the leakage current, silicon area, and performance characteristics of two data retention flip flop circuits used as a benchmark. The particular values for the desirable attributes used as a benchmark may be application specific, e.g., performance to be within 90% of a benchmark, reduction in leakage current to be at least 15% of a benchmark, reduction in silicon area to be within plus or minus 5% of a benchmark, and similar others. The lower leakage current is achieved by reducing the number of active devices used for data retention compared to the benchmark circuits, the active devices being powered by a standby power source in the standby power mode to produce the leakage current. The data retention feature is advantageously embedded in a slave latch portion of a data retention flip flop, thereby minimizing the impact on the normal operation of the flip flop. The improved apparatus and method for data retention may be configured to advantageously exclude gating of the clock path, e.g., the clock is only buffered with two inverters to derive CLKZ and CKT signals without having any additional gating circuitry for deriving other clock signals, thereby improving the performance and robustness.

BRIEF DESCRIPTION OF THE DRAWINGS

FIG. 6A is tabular data illustrating silicon area comparison for data retention circuits described with reference to FIGS. 1, 3, 4 and 5, a number of transistors used in the data retention circuits being a measurement for the silicon area, according to an embodiment;

FIG. 6B is tabular data illustrating performance comparison for data retention circuits described with reference to FIGS. 1, 3, 4 and 5, the performance being measured as circuit response time measured in picoseconds, according to an embodiment;

FIG. 6C is tabular data illustrating leakage current (measured in nanoamperes) for comparing data retention circuits described with reference to FIGS. 1, 3, 4 and 5, according to an embodiment.

DETAILED DESCRIPTION

Figure 1:
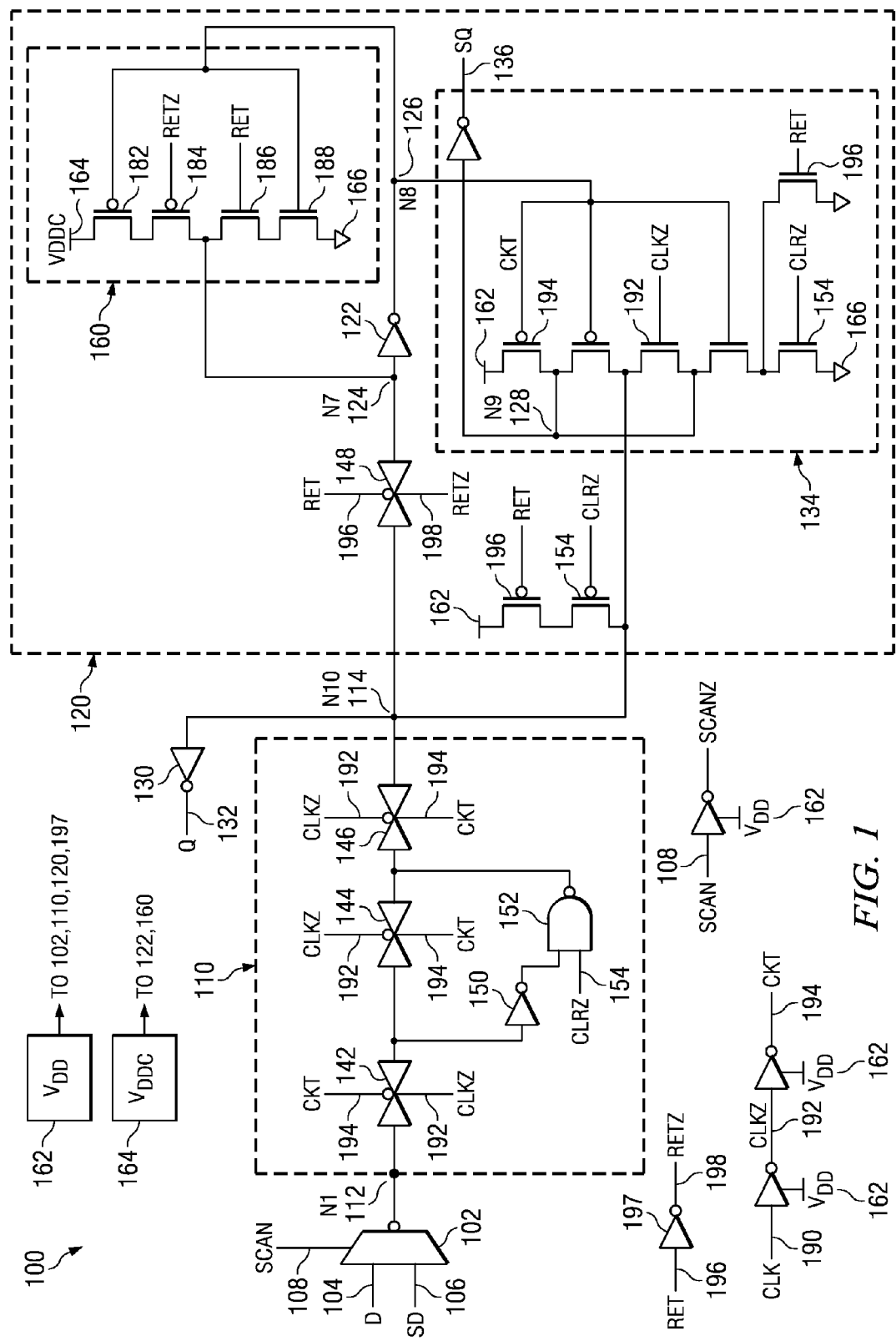
FIG. 1 is a simplified circuit diagram of a data retention apparatus, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Providing data retention circuits having desirable characteristics for leakage current, performance, and silicon area has been a challenge since improvement in one parameter is often achieved at the cost of others. For example, an exemplary data retention circuit optimized for reduced leakage current may use increased silicon area and deliver undesirable performance and operating characteristics in low voltage operations. As another example, another exemplary data retention circuit optimized for improved performance and improved operating characteristics in low voltage operations may be ineffective due to an increase in leakage current that may exceed a desirable target. These problems, among others, may be addressed by an improved apparatus and method for data retention. According to an embodiment, in a method and apparatus for data retention, a first latch latches a data input and a second latch that is coupled to the first latch retains the data input while the first latch is inoperative in a standby power mode. The second latch includes a second latch inverter having an inverter input and an inverter output. A switching circuit, which may be implemented as a tristate inverter, is coupled to the inverter output, the inverter input, and a retention signal. The switching circuit is operable in the standby power mode to assert a logic state at the inverter input responsive to the retention signal. The logic state is in accordance with the data input retained in the standby power mode. A standby power source is operable to provide power in the standby power mode to the second latch inverter, the switching circuit and the retention input. A data retention apparatus having a reduced leakage current is described with reference to FIGS. 1, 2A, 2B, and 3. Benchmarking of the data retention apparatus described with reference to FIGS. 1, 2A, 2B, and 3 with a high performance type data retention circuit and a reduced leakage type data retention circuit is described with reference to FIGS. 4, 5, 6A, 6B, 6C and 7.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more ICs packaged into a module.

Data retention flip flop—A flip flop type that is operable to save, retain, or preserve data during a power saving mode (also referred to as data retention mode, reduced power mode, or standby power mode) of operation and operates as a traditional flip flop during a non-power saving mode of operation.

Leakage current in a data retention flip flop—A current flowing through the data retention flip flop operating in a power saving mode to retain data.

Clock low retention flip flop—A data retention flip flop that retains data only when a clock signal is held at a low level at the time the flip flop exits the power saving mode.

Clock free retention flip flop—A data retention flip flop that retains data independent of a high or low state of a clock signal at the time the flip flop exits the power saving mode.

Configuration—Describes a set up of an element, a circuit, a package, an electronic device, and similar other, and refers to a process for setting, defining, or selecting particular properties, parameters, or attributes of the device prior to or during its use or operation. Some configuration attributes may be selected to have a default value. For example, during periods of inactivity a scalable power supply may be configured to operate at a lower voltage level to advantageously save power. That is, the voltage level of the power supply may be configured to operate at approximately 1 volt, e.g., 0.9 volts to 1.5 volts.

FIG. 1 is a simplified circuit diagram of a data retention apparatus 100, according to an embodiment. The data retention apparatus 100 implemented as a circuit includes a first latch 110 (also referred to as a master latch) coupled to a second latch 120 (also referred to as a slave latch). In an exemplary, non-depicted embodiment, the data retention device 100 is included in an electronic device such as a cellular phone, a digital camera/camcorder, a pocket computer, a laptop computer, a personal entertainment device or any other similar portable, battery operated device. The electronic devices include multiple chips such as microprocessors, digital signal processors, radio frequency circuits, memory, microcontrollers such as input/output controllers, and the like. The electronic device and hence the data retention apparatus 100 is operable in at least two operating modes a normal operating mode consuming rated power during periods of normal chip activity and a standby power mode consuming reduced power during periods of inactivity or reduced activity.

The first latch 110 is coupled to a multiplexer 102 to receive a data input D 104 or a scan data input SD 106. A scan control input 108 selects one of the data input D 104 or the SD 106 as an input received at node N1 112 of the first latch 110. The first latch 110 provides an output at node N10 114 that is coupled to the second latch 120 as an input. An output inverter 130 receives the output at node N10 114 and provides an output Q 132 of the data retention apparatus 100. Included in the first latch 110 and disposed in series between the node N1 112 and the node N10 114 are signal gates (also referred to as transmission gates) SG1 142 controlled by CKT 194 and CLKZ 192, SG2 144 controlled by CLKZ 192 and CKT 194, and SG3 146 controlled by CLKZ 192 and CKT 194. Coupled in parallel to the SG2 144 is a series combination of a master inverter 150 coupled to a NAND gate 152. CLRZ 154 is an asynchronous reset signal that is received by the NAND gate 152 to reset the output Q 132 to a logic low state. During normal operating mode, the data retention apparatus 100 operates as a traditional flip flop. The first latch 110 and the second latch 120 work in combination controlled by the CLK 190, to store and propagate input data D 104 to the output Q 132. Data stored in the first latch 110 is propagated to the output Q 132 when CLK 190 is high (this also writes data in parallel to the second latch 120 when CLK 190 is high). Data stored in the second latch 120 is propagated to the output Q 132 when CLK 190 is low. At this time (when CLK 190 is low) new data is being written to the first latch 110. Unlike a traditional flip flop, the second latch 120 advantageously includes additional circuitry for data retention, the additional circuitry contributing to reduced leakage current, while attaining desired performance and being implementable in a desired silicon area.

In the standby power mode, the second latch 120 is operable to retain a state of the data input D 104 and restore the retained state of the data input D 104 as the output Q 132 upon exiting the standby power mode. The data retention apparatus 100 enters the standby power mode when: 1) the CLK 190 is gated low, and 2) a RET 196 signal is switched from a low state to a high state. A RETZ 198 signal, which is the inverse of RET 196, transitions from a high state to a low state upon entering the standby power mode. Similarly, the data retention apparatus 100 returns to normal operating mode or active power mode from the standby power mode in response to a transition of the RET 196 signal from a high state to a low state. The inverse of RET 196 is a RETZ 198 signal that transitions from a low state to a high state upon entering the normal operating mode.

Unlike a conventional master-slave flip flop, which is typically powered by a single power source and which does not retain data when the single power source is removed from the flip-flop, the data retention apparatus 100 is powered by two power sources, a switchable power source $V_{DD}$ 162 and a standby power source $V_{DDC}$ 164. The standby power source $V_{DDC}$ 164 provides power that is independent of the power saving mode of operation. That is, the standby power source $V_{DDC}$ 164 is active, e.g., switched on, during all power modes including the standby power mode and the active power mode. Any circuits and/or devices powered by the standby power source $V_{DDC}$ 164 continue to receive power in the standby power mode as well as the active power mode. Any current flowing through the circuits and/or devices powered by the standby power source $V_{DDC}$ 164 operating in a standby power mode is described as a leakage current. The switching off of the switchable power source $V_{DD}$ 162 to save power has no effect on the input data D 104 retained in the second latch 120.

In a particular embodiment, both the switchable power source $V_{DD}$ 162 and the standby power source $V_{DDC}$ 164 may be derived from a single, system level power source and may have a scalable supply voltage. That is, a voltage level of the $V_{DD}$ 162 and a voltage level of the $V_{DDC}$ 164 may be varied, e.g., scaled up or scaled down, depending on the activity level. Thus, during periods of inactivity the voltage level may be advantageously scaled down, e.g., configured between 0.9 volts to 1.5 volts, to reduce power consumption.

In the depicted embodiment, the data retention apparatus 100 is a clock low type flip flop that uses a clock signal held at a low level at the time the flip flop exits the power saving mode. In a particular embodiment, each one of the first latch 110 and the second latch 120 include a plurality of transistors, each of which has a substantially similar threshold voltage. The plurality of transistors used in the first latch 110 and the second latch 120 are advantageously operable at lower, scaled down operating voltages that are less than 1 volt, e.g., 0.9 volts. Each one of the plurality of transistors also includes a gate oxide layer having a substantially similar thickness.

The second latch 120 includes a second latch inverter 122 having an inverter input received at node N7 124 and providing an inverter output at node N8 126. A switching circuit 160 is coupled between the node N8 126 and N7 124. The switching circuit 160 and the second latch inverter 122 are coupled in a back to back or a cross coupling arrangement to retain data. The switching circuit 160 is operable as an inverter and is controlled by RET 196 and RETZ 198. In the depicted embodiment, the second latch inverter 122, the switching circuit 160, node N7 124, and node N8 126 are powered by the standby power source $V_{DDC}$ 164 that is capable of providing power in the standby power mode. In addition, RET 196 signal is generated by external circuits (e.g., external to the data retention circuit 100, the external circuits are not shown), which receive power from the standby power source $V_{DDC}$ 164. Remaining devices, components, nodes or signals of the data retention apparatus 100 are powered by the switchable power source $V_{DD}$ 162, which is capable of being switched off in the standby power mode, thereby reducing power consumption. For example, an inverter 197 for inverting RET 196 to RETZ 198 is powered by $V_{DD}$ 162. In the standby power mode RET 196 is high and n-mos of the inverter 197 propagates low level as an output, e.g., RETZ 198 is low. Thus, propagation of RETZ 198 in low state is advantageously accomplished without powering the inverter 197, e.g., by using $V_{DD}$ 162 which may be switched off in the standby power mode. The switching circuit 160 is operable to retain the last state of the data input D 104 received from the first latch 110 prior to entering the standby power mode. A signal gate SG4 148 controlled by RET 196 and RETZ 198 signals is disposed between the node N 10 and N7 124 to enable or disable input from the first latch 110. The second latch 120 also includes a circuit to disable CLRZ 154 signal in retention mode, e.g., when RET 196 is high. That is, if CLRZ 154 is asserted in the standby power mode it will have no effect on the state of the data input D 104 retained by the second latch 120.

The switching circuit 160 also includes a plurality of transistors coupled in series between the standby power source $V_{DDC}$ 164 and a voltage reference 166 such as a ground reference. The switching circuit 160 is operable in the standby power mode to assert a logic state at an input of the second latch inverter 122 responsive to the RET 196 and RETZ 198 retention signals. In the depicted embodiment, the plurality of transistors include a first switch 182 that is operative in response to a retained state of the data input D 104 being in a low state; a second switch 184 that is operative in response to the RETZ 198 signal being in a low state, a third switch 186 that is operative in response to the RET 196 signal being in a high state, and a fourth switch 188 that is operative in response to the retained state of the data input D 104 being in a high state. In the depicted embodiment, the first switch 182 and the second switch 184 are implemented as p-mos field effect transistors and the third switch 186 and the fourth switch 188 are implemented as n-mos field effect transistors. In an exemplary, non-depicted embodiment, the switching circuit 160 is implemented as a tristate inverter controlled by RET 196 and RETZ 198 signals. When RET 196 is high and RETZ 198 is low, the tristate inverter inverts input data and passes it as the output. When RET 196 is low and RETZ 198 is high, the tristate inverter provides high output impedance.

The second latch 120 also includes an output generating circuit 134 disposed between the node N8 126 and the node N10 114. The output generating circuit 134 includes four switches coupled in series and a pair of switches in parallel disposed between the switchable power source $V_{DD}$ 162 and the reference voltage 166. The output generating circuit 134 is controlled by a state of the node N8 126, which stores a state corresponding to the data input D 104, CKT 194 and CLKZ 192 signals. When node N8 126 is at a low state and CKT 194 is low, node N10 114 is at a high state, and output Q 132 is restored to a low state. When node N8 126 is at a high state and CLKZ 192 is high (or CLK 190 is low), node N10 114 is at a low state, and output Q 132 is restored to a high state. Current path from the switchable power source $V_{DD}$ 162 to the reference voltage 166 is disabled when both RET 196 and CLRZ 154 is at a low level (since the two n-mos transistor switches are coupled in parallel). A scan output SQ 136 is generated as an inverse state of node N9 128, with node N9 tracking an inverse state of the node N8 126. The operating state of the output generating circuit 134 and the state of the CLK 190 is indeterminate in the standby power mode, e.g., when the switchable power source $V_{DD}$ 162 is switched off and RET 196 is asserted to a logic high.

When the electronic device experiences an increase in activity, the data retention apparatus 100 exits the standby power mode. The switchable power source $V_{DD}$ 162 is switched on, CLK 190 continues to be gated low, and RET 196 is high. This causes the output Q 132 to be restored to the state of the data input D 104 retained in the second latch 120. Thus, within a few nanoseconds, the data retention apparatus 100 is restored to the same state prior to entering the standby power mode. The RET 196 signal is set to low and the RETZ 198 signal is set to high. The CLK 190, which was gated low in the standby power mode, is released and the data retention flip flop resumes normal operation in the active power mode. Additional details of the data retention apparatus 100 such as timing aspects are described with reference to FIGS. 2A and 2B.

Figure 2A:
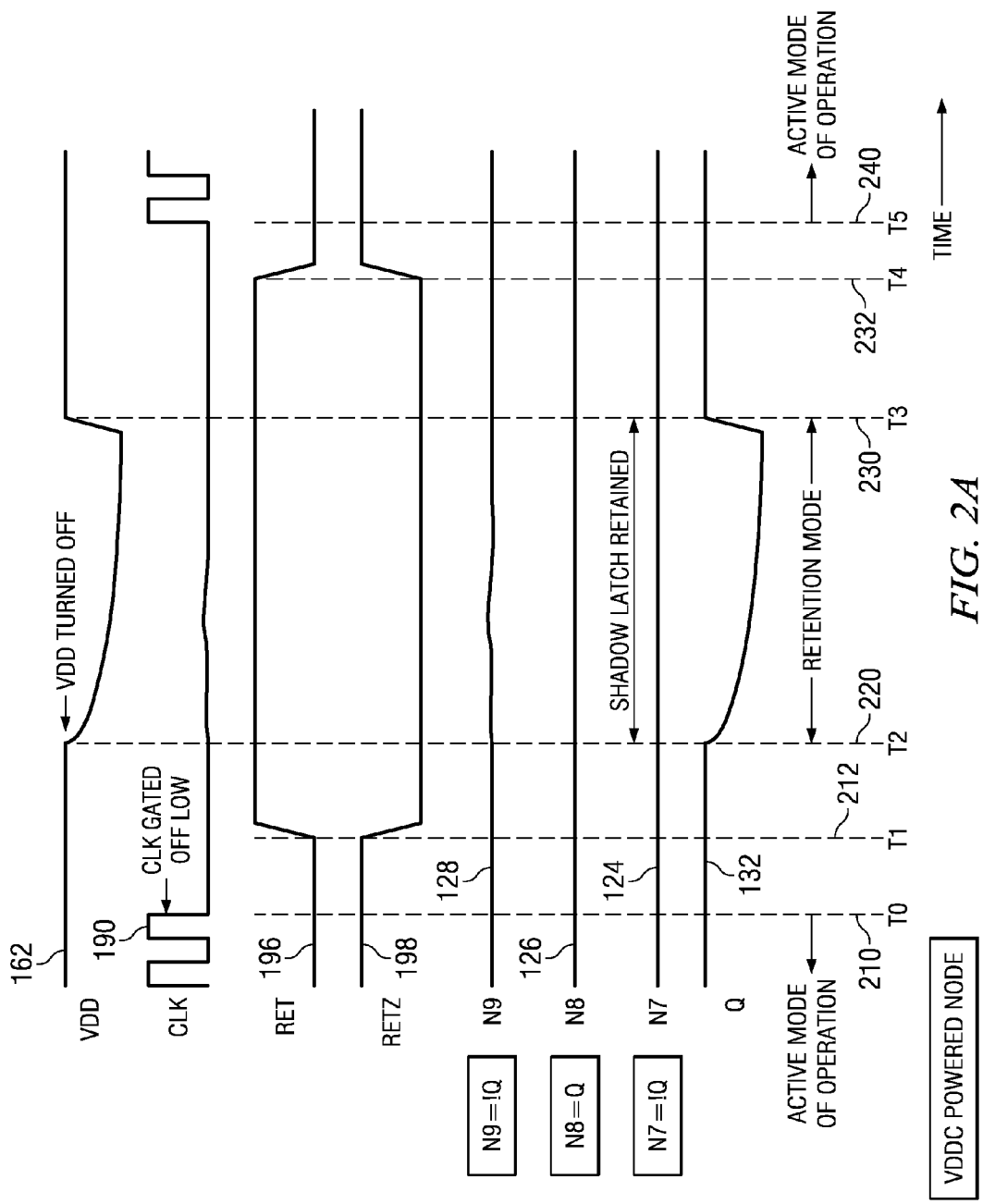
FIGS. 2A and 2B illustrate waveforms associated with a data retention apparatus described with reference to FIG. 1, according to an embodiment.
Figure 2B:
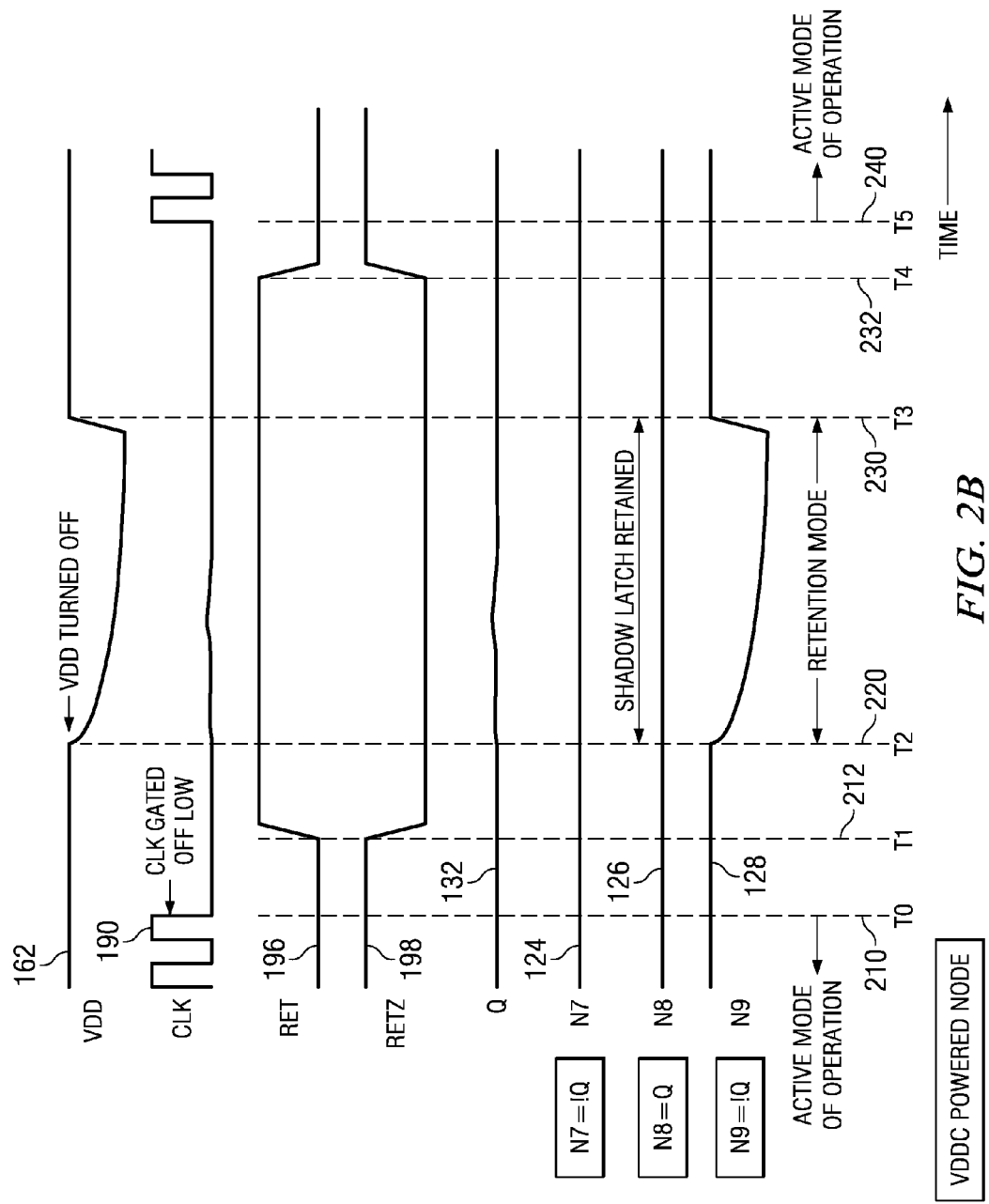

FIGS. 2A and 2B illustrate waveforms associated with a data retention apparatus 100 of FIG. 1, according to one embodiment. Referring to FIG. 2A, at time $t=t_0$ 210, the CLK 190 is gated low (by a device or circuit that is included in the electronic device but excluded from the data retention apparatus 100) and is indicative of a transition from an active power mode to a standby power mode. The output Q 132 is held to a high level, which is the state of the data input 140 when CLK 132 is gated to low. Node N7 124 and N8 126, both of which are powered by the standby power source $V_{DDC}$ 164, are respectively at the low level and the high level. Node N9 128, which is powered by the switchable power source $V_{DD}$ 162, is at a low level. At $t=t_1$ 212, the RET 196 signal is set to a high level and the RETZ 198 signal is set to a low level. At $t=t_2$ 220, the data retention apparatus 100 is operating in the standby power mode. The switchable power source $V_{DD}$ 162 is switched off and its voltage decays over time. The standby power source $V_{DDC}$ 164 continues to provide power. An operating state of the output Q 132 and of other nodes such as N9 128, all of which are powered by the switchable power source $V_{DD}$ 162, is undefined. The output Q 132 decays over time. At $t=t_3$ 230, the data retention apparatus 100 is ready to exit the standby power mode. The switchable power source $V_{DD}$ 162 is switched on and its voltage is restored to its normal value. The output Q 132 is set to high, which was the retained state before entering the standby power mode. At $t=t_4$ 232, the RET 196 signal is set to low and the RETZ 198 signal is set to high. At $t=t_5$ 240, the CLK 190 which was gated low in the standby mode, is released and is indicative of a completion of transition of the data retention apparatus 100 from the standby power mode to the active power mode.

Referring to FIG. 2B, at time $t=t_0$ 210, the CLK 190 is gated low (by a device or circuit that is included in the electronic device but excluded from the data retention apparatus 100) and is indicative of a transition from an active power mode to a standby power mode. The output Q 132 is held to a low level, which is the state of the data input 140 when CLK 132 is gated to low. Node N7 124 and N8 126, both of which are powered by the standby power source $V_{DDC}$ 164, are respectively at the high level and the low level. Node N9 128, which is powered by the switchable power source $V_{DD}$ 162, is at a high level. At $t=t_1$ 212, the RET 196 signal is set to a high level and the RETZ 198 signal is set to a low level. At $t=t_2$ 220, the data retention apparatus 100 is operating in the standby power mode. The switchable power source $V_{DD}$ 162 is switched off and its voltage decays over time. The standby power source $V_{DDC}$ 164 continues to provide power. An operating state of the output Q 132 and of other nodes such as N9 128, all of which are powered by the switchable power source $V_{DD}$ 162, is undefined. The voltages of the switchable power source $V_{DD}$ 162 and the node N9 128 decay over time. At $t=t_3$ 230, the data retention apparatus 100 is ready to exit the standby power mode. The switchable power source $V_{DD}$ 162 is switched on and its voltage is restored to its normal value. The node N9 128 is restored a high level. The output Q 132 is set to low, which was the retained state before entering the standby power mode. At $t=t_4$ 232, the RET 196 signal is set to low and the RETZ 198 signal is set to high. At $t=t_5$ 240, the CLK 190 which was gated low in the standby mode, is released and is indicative of a completion of transition of the data retention apparatus 100 from the standby power mode to the active power mode.

Figure 3:
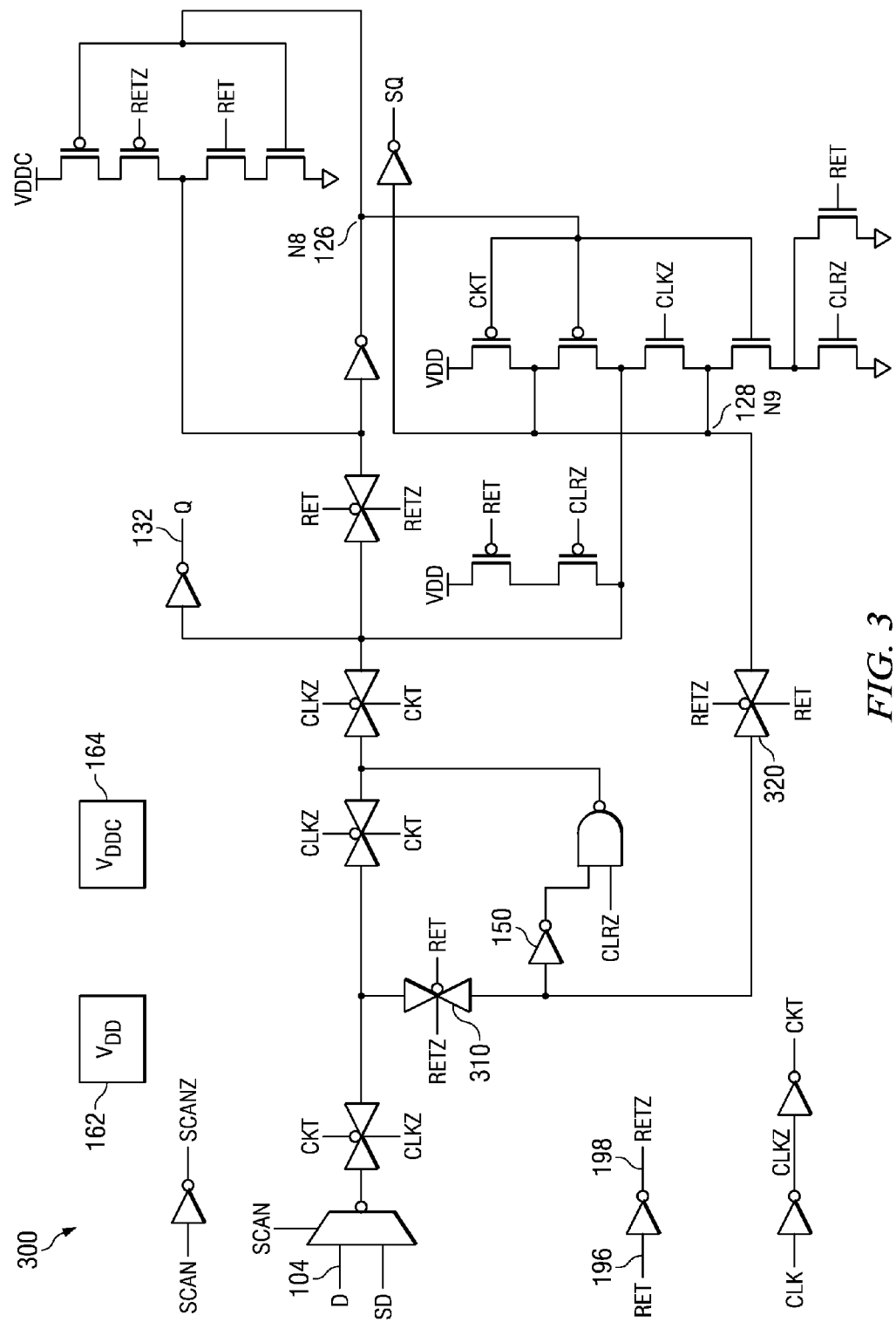
FIG. 3 is a simplified circuit diagram of a clock free type data retention apparatus, according to an embodiment.

FIG. 3 is a simplified circuit diagram of a clock free type data retention apparatus 300, according to an embodiment. As described earlier, a clock free retention flip flop is a type of data retention flip flop that retains input data independent of a high state or a low state of a clock signal at the time the flip flop exits the power saving mode. In the depicted embodiment, the clock free type data retention apparatus 300 is substantially the same as the clock low type data retention apparatus 100 described with reference to FIG. 1, with the exception of additional signal gates SG5 310 controlled by RET 196 and RETZ 198 signals and SG6 320 controlled by RETZ 198 and RET 196 signals. During normal operation SG5 310 enables the data input D 104 to pass through to the master inverter 150 and SG6 320 is disabled. During a transition from standby power mode to an active power mode, when $V_{DD}$ 162 is turned on and RETZ 198 is still low, SG5 310 is disabled and SG6 320 enables retained data to be transferred from node N8 126 to node N9 128 to the master inverter 150 to the output Q 132.

Figure 4:
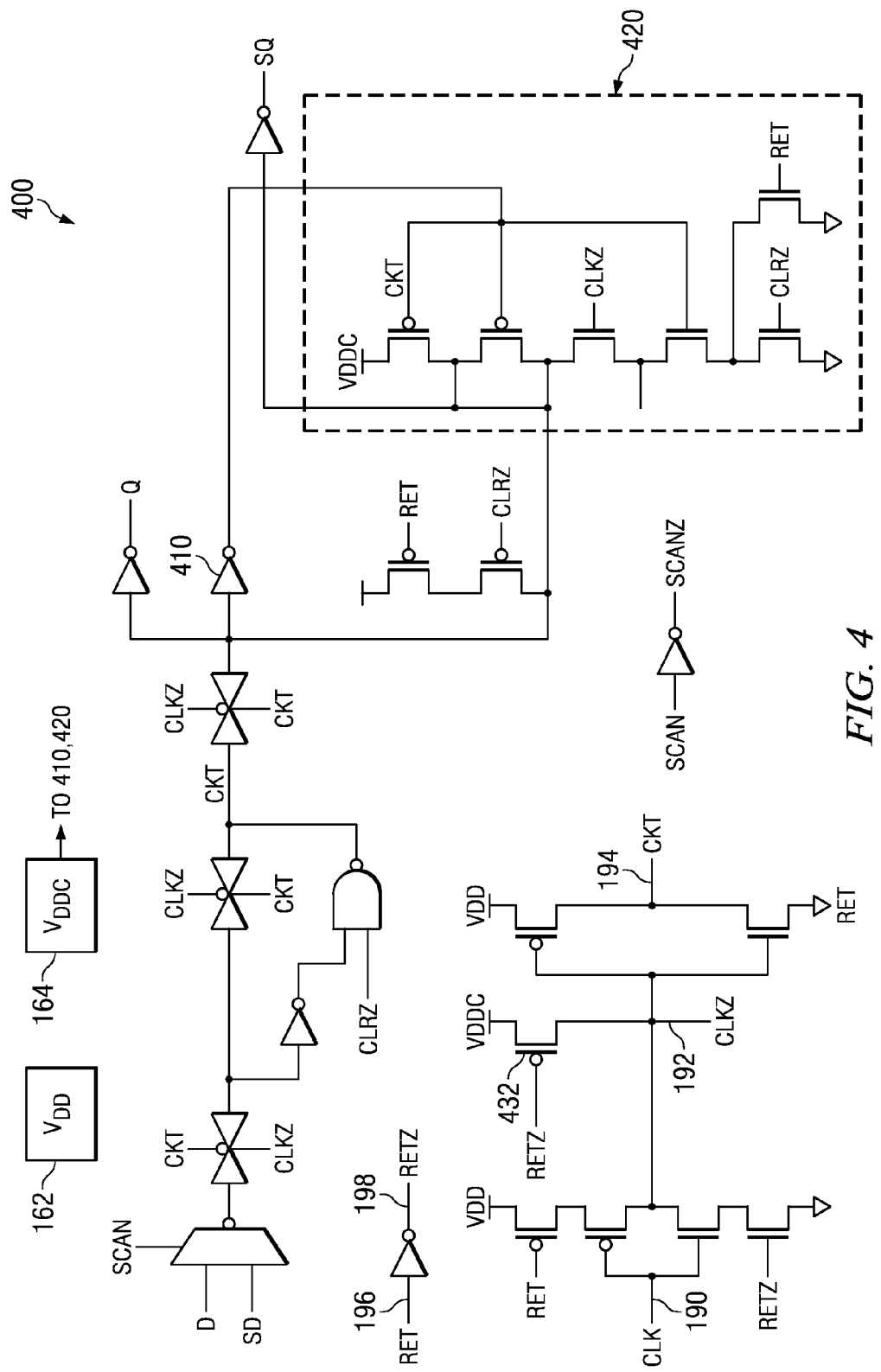
FIG. 4 is a schematic diagram of a high performance type data retention circuit for conducting a benchmark test.

FIG. 4 is a schematic diagram of a high performance type data retention circuit 400 for conducting a benchmark test. The high performance type data retention circuit 400 is a master-slave, clock gating type flip flop and includes a slave inverter 410 and a state retention circuit 420, both of which are powered by the standby power source $V_{DDC}$ 164 described with reference to FIG. 1. The standby power source $V_{DDC}$ 164 also provides power to a switch SI 432 included in a clock circuit 430. The switch S1 432 is controlled by RETZ 198 signal. In the standby power mode of operation, switch S1 432 is closed and CLKZ 192 is asserted to a high level due to the standby power source $V_{DDC}$ 164. In an exemplary, non-depicted embodiment, signal gates may be added to the high performance type data retention circuit 400 (similar to SG5 310 and SG6 320 described with reference to FIG. 3) to add a clock free feature that retains input data independent of a high state or a low state of a clock signal at the time the flip flop exits the power saving mode.

Figure 5:
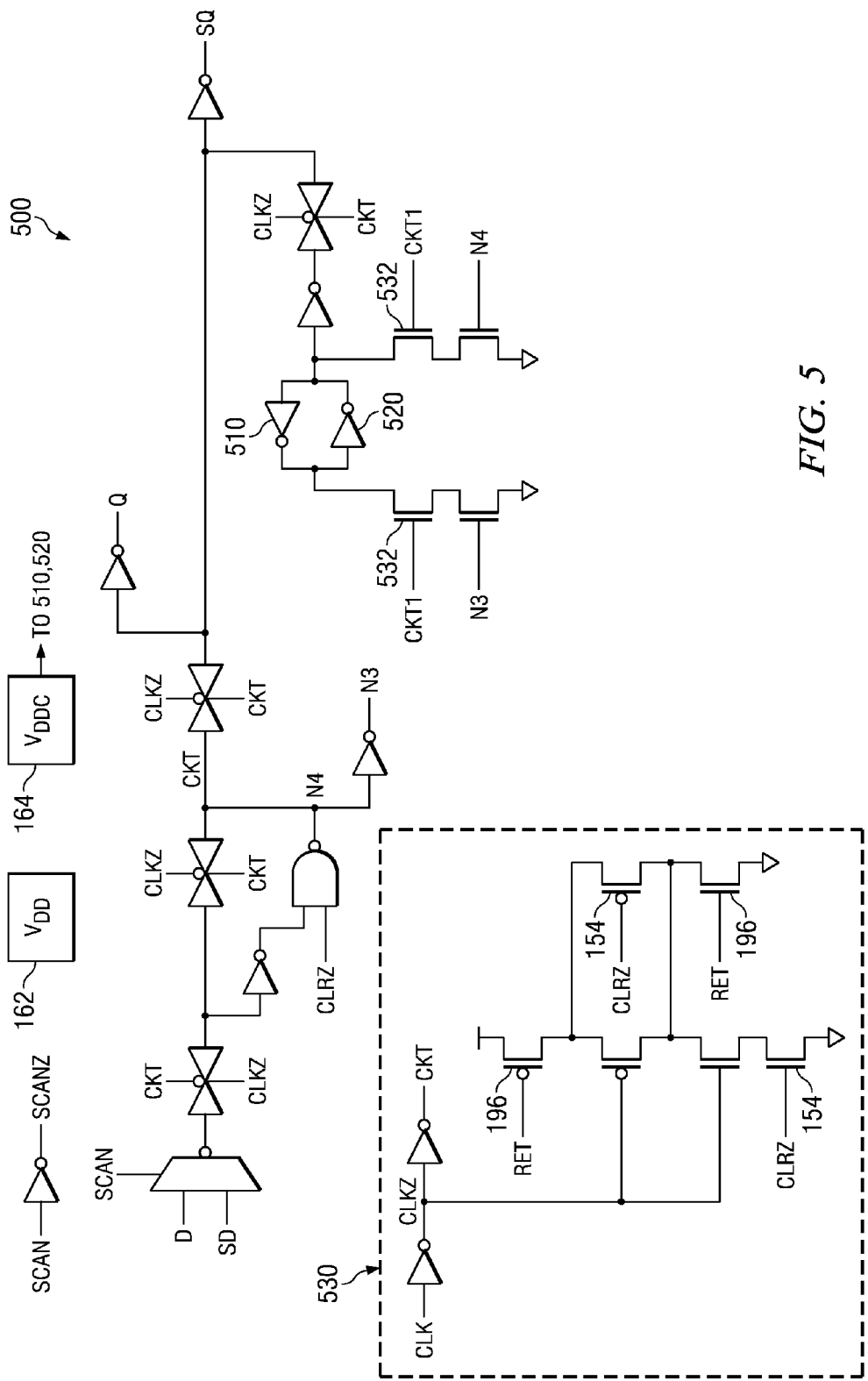
FIG. 5 is a schematic diagram of a reduced leakage type data retention circuit for conducting a benchmark test.

FIG. 5 is a schematic diagram of a reduced leakage type data retention circuit 500 for conducting a benchmark test. The reduced leakage type data retention circuit 500 is a master-slave, jam latch type flip flop and includes a pair of slave inverters 510 and 520 coupled in a back-to-back arrangement to retain data. The slave inverters 510 and 520 are powered by the standby power source $V_{DDC}$ 164 described with reference to FIG. 1. A clock circuit 530 includes a plurality of switches controlled by RET 196, CLKZ 192, and CLRZ 154 signals to derive a CKT1 532 signal. The CKT1 532 signal controls data input to the slave inverters 510 and 520. CKT1 532 is same as CKT 194 in normal operating state when CLRZ 154 is inactive. In case CLRZ 154 is active and with CKT1 532 being controlled by CLRZ 154, then CKT 194 will be different than CKT1 532. In an exemplary, non-depicted embodiment, signal gates may be added to the reduced leakage type data retention circuit 500 (similar to SG5 310 and SG6 320 described with reference to FIG. 3) to add a clock free feature that retains input data independent of a high state or a low state of a clock signal at the time the flip flop exits the power saving mode.

FIGS. 6A, 6B, and 6C include tabular data illustrating silicon area, performance, and leakage current comparison for data retention circuits described with reference to FIGS. 1, 2A, 2B, 3, 4 and 5, according to an embodiment. Referring to FIG. 6A, table 610 includes transistor counts for data retention circuits (clock low and clock free types) described with reference to FIGS. 1, 2A, 2B, 3, 4 and 5. A number of transistors included in a circuit are a measure of the silicon area required on an IC to implement the data retention circuit. For the clock low type, the data retention apparatus 100 includes 48 transistors compared to 45 transistors in the high performance type data retention circuit 400 and 50 transistors in the reduced leakage type data retention circuit 500. Thus, the silicon area of the data retention apparatus 100 is about 4% less compared to the silicon area of the reduced leakage type data retention circuit 500 and is about 7% greater than the silicon area of the high performance type data retention circuit 400. In an embodiment, all additional transistors included in the data retention apparatus 100 are advantageously of a minimum size.

Referring to FIG. 6B, table 620 includes performance measurements (measured in pico seconds) for the data retention apparatus 100, the high performance type data retention circuit 400, and the reduced leakage type data retention circuit 500. Table 620 illustrates various response times, delay times, set up times (TSU), and black hole times (BHT) computed for the various clock low type and clock free type data retention circuits using simulation tools. A W_125_1.08 PTV (Process, temperature, and voltage) condition is used to compute the values. The performance measurements indicate that the performance of the data retention apparatus 100 is comparable (within desired limits, e.g., within 10%) to the performance of the high performance type data retention circuit 400 and exceeds the performance of the reduced leakage type data retention circuit 500.

Referring to FIG. 6C, table 630 includes leakage current measurements (measured in nano amperes) for the data retention apparatus 100, the high performance type data retention circuit 400, and the reduced leakage type data retention circuit 500. Table 630 illustrates average leakage current computed at various temperature conditions for the clock low type data retention circuits using simulation tools. PTV (Process, temperature, and voltage) conditions used in the simulation include S_30_1.2, S_85_1.2 and S_105_1.2. The leakage current comparison indicates that the leakage current drawn by the data retention apparatus 100 is about 450% less compared to the leakage current drawn by the high performance type data retention circuit 400 and is about 19% less than the leakage current drawn by the reduced leakage type data retention circuit 500.

Figure 7:
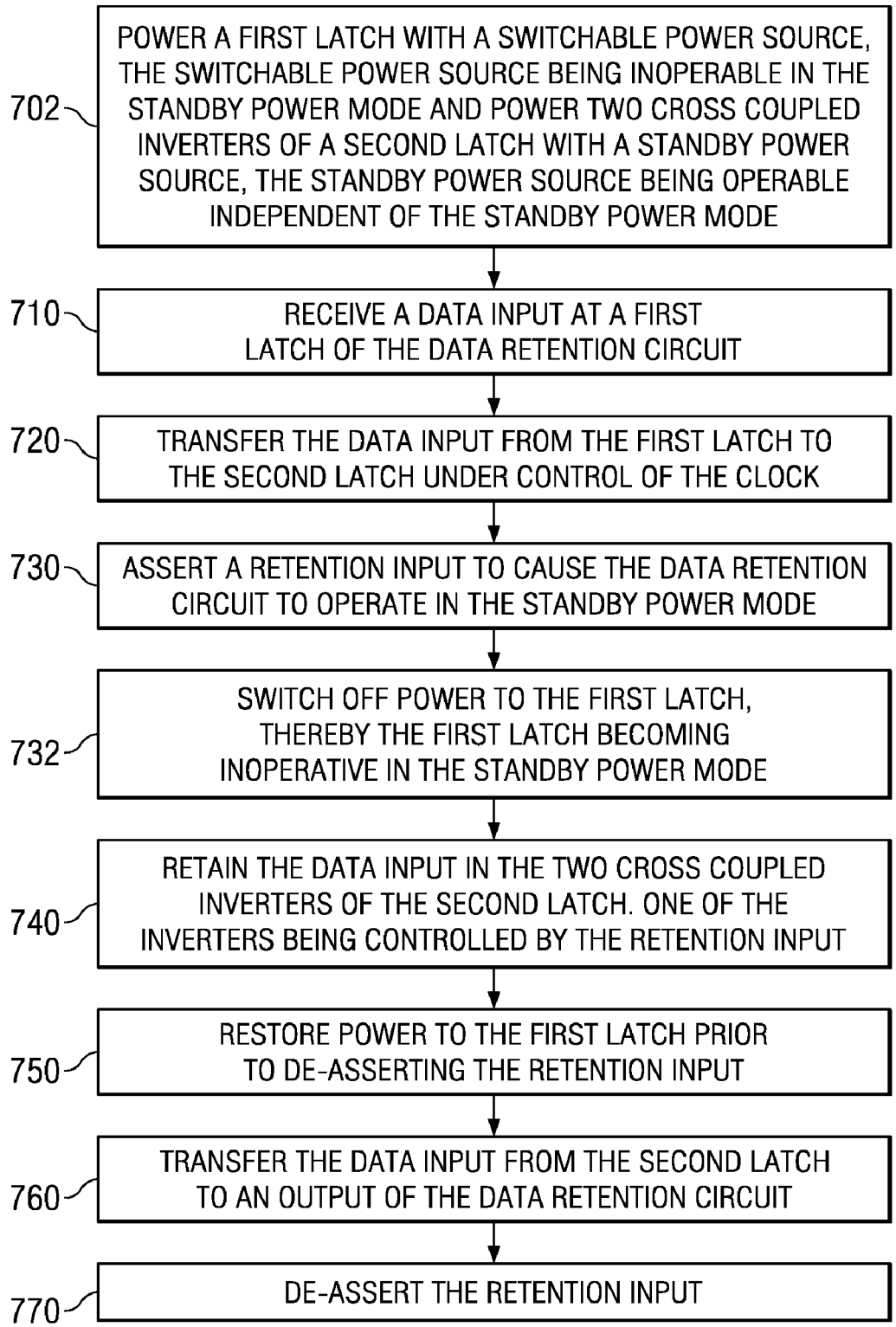
FIG. 7 is a flow chart illustrating a method for reducing leakage current of a data retention circuit operable in a standby power mode, according to an embodiment.

FIG. 7 is a flow chart illustrating a method for reducing leakage current using a data retention circuit operable in a standby power mode, according to an embodiment. In a particular embodiment, FIG. 7 illustrates the method for reducing leakage current using the data retention apparatus described with reference to FIGS. 1, 2A, 2B, and 3. The method illustrates a transition sequence of the retention circuit between active mode to standby mode and return to active mode of operation. At step 710, a data input is received at a first latch of the data retention circuit. At step 720, the data input is transferred from the first latch to the second latch under control of the clock. At step 730, a retention input is asserted to cause the data retention circuit to operate in the standby power mode. At step 732, power to the first latch is switched off, thereby becoming inoperative in the standby power mode. At step 740, the data input is retained in two cross coupled inverters of the second latch. One of the inverters is controlled by the retention input. At step 750, power to the first latch is restored prior to de-asserting the retention input. At step 760, the data input is transferred from the second latch to an output of the data retention circuit. At step 770, the retention input is de-asserted.

Various steps described above may be added, omitted, combined, altered, or performed in different orders. For example, a step 702 is added before step 710 to provide power to the first and second latches. At step 702, the first latch is powered by a switchable power source and the two cross coupled inverters of the second latch are powered by a standby power source, the switchable power source being inoperable in the standby power mode and the standby power source being operable independent of the standby power mode.

Several advantages are achieved by the method and system according to the illustrative embodiments presented herein. The embodiments advantageously provide an improved apparatus and method for data retention in a standby power mode. The improved apparatus and method for data retention advantageously provides a lower leakage current while providing desirable performance and desirable reduction in silicon area, especially when compared to the leakage current, silicon area, and performance characteristics of two data retention flip flop circuits used as a benchmark. The particular values for the desirable attributes used as a benchmark may be application specific, e.g., performance to be within 90% of a benchmark, reduction in leakage current to be at least 15% of a benchmark, reduction in silicon area to be within plus or minus 5% of a benchmark, and similar others. The lower leakage current is achieved by reducing the number of active devices used for data retention compared to the benchmark circuits, the active devices being powered by a standby power source in the standby power mode to produce the leakage current. The data retention feature is advantageously embedded in a slave latch portion of a data retention flip flop, thereby minimizing the impact on the normal operation of the flip flop. The improved apparatus and method for data retention may be configured to advantageously exclude gating of the clock path, e.g., the clock is only buffered with two inverters to derive CLKZ and CKT signals without having any additional gating circuitry for deriving other clock signals, thereby improving the performance and robustness.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of a flip flop with an asynchronous reset, the methods and circuits described herein may be applied to other types of flip flops with or without resets.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data retention apparatus comprising:
a first latch for latching a data input and transmitting a data output; and
a second latch coupled to the first latch for retaining the data input while the first latch is inoperative in a standby power mode, wherein the second latch includes:
  a second latch inverter having an inverter input and an inverter output;
  a switching circuit coupled to the inverter output, the inverter input, and a retention signal, wherein the switching circuit is operable in the standby power mode to assert a logic state at the inverter input responsive to the retention signal, wherein the logic state is in accordance with the data input retained in the standby power mode;
  a standby power source operable to provide power in the standby power mode, the standby power source being coupled to the second latch inverter and the switching circuit;
  an output generating circuit having an input coupled to the inverter output and an output coupled to the data output, wherein the output generating circuit is inoperative in the standby power mode.

2. The data retention apparatus of claim 1, wherein the switching circuit includes:
  a plurality of switches coupled in series between the standby power source and a voltage reference, wherein the plurality of switches include:
  a first switch coupled to the standby power source, the first switch being controlled by the inverter output;
  a second switch coupled to the first switch and the inverter input, the second switch being controlled by an inverse of the retention signal;
  a third switch coupled to the second switch, the third switch being controlled by the retention signal; and
  a fourth switch coupled to the third switch and the voltage reference, the forth switch being controlled by the inverter output.

3. The data retention apparatus of claim 2, wherein:
the first switch is operative in response to a retained state of the data input being low;
the second switch is operative in response to the inverse of the retention signal being low;
the third switch is operative in response to the retention signal being high; and
the fourth switch is operative in response to the retained state of the data input being high.

4. The data retention apparatus of claim 1 further comprising:
a switchable power source coupled to the first latch, wherein the standby power source is different than the switchable power source, wherein each one of the switchable power source and the standby power source has a scalable supply voltage.

5. The data retention apparatus of claim 4, wherein the switchable power source is powered off in response to a change in the retention signal, thereby causing the first latch to become inoperative.

6. The data retention apparatus of claim 4 further comprising:
a clock circuit having a clock input, the clock circuit being powered by the switchable power source;
a retention input capable of being asserted to a logic high level in the standby power mode; and
an asynchronous reset input capable of being asserted to reset the first latch and the second latch.

7. The data retention apparatus of claim 6, wherein the clock input is capable of being deasserted to a low logic level when the retention input is asserted.

8. The data retention apparatus of claim 6, wherein the retention of the data input during the standby power mode is independent of a state of the clock input.

9. The data retention apparatus of claim 1, wherein a reduction in leakage current drawn by the second latch from the standby power supply is approximately 450% less compared to a high performance type data retention circuit.

10. The data retention apparatus of claim 9, wherein an area overhead associated with the second latch is approximately 7% greater than the high performance type data retention circuit.

11. The data retention apparatus of claim 1, wherein a reduction in leakage current drawn by the second latch from the standby power supply is approximately 19% less compared to a reduced leakage type data retention circuit.

12. The data retention apparatus of claim 10, wherein an area overhead associated with the second latch is approximately 4% less than the reduced leakage type data retention circuit.

13. The data retention apparatus of claim 1, wherein each one of the first latch, the second latch include a plurality of transistors, wherein each one of the plurality of transistors has a substantially similar threshold voltage, wherein an operating voltage of the plurality of transistors is adjustable to be less than 1 volt.

14. The data retention apparatus of claim 1, wherein each one of the first latch, the second latch and the controller include a plurality of transistors, wherein each one of the plurality of transistors includes a gate oxide layer having a substantially similar thickness.

15. A method for reducing leakage current using a data retention circuit operable in a standby power mode, the method comprising:
- receiving a data input at a first latch of the data retention circuit;
- transferring the data input from the first latch to a second latch;
- asserting a retention input to cause the data retention circuit to operate in the standby power mode, the first latch becoming inoperative in the standby power mode;
- retaining the data input in two cross coupled inverters of the second latch, wherein one of the two cross coupled inverters is controlled by the retention input;
- restoring power to the first latch prior to de-asserting the retention input;
- transferring the data input from the second latch to an output generating circuit, which is inoperative during the standby power mode;
- transferring the data input from the output generation circuit to an output of the data retention circuit; and de-asserting the retention input.

16. The method of claim 15 further comprising:
- powering the first latch with a switchable power source, the switchable power source being inoperable in the standby power mode; and
- powering the two cross coupled inverters with a standby power source, the standby power source being operable independent of the standby power mode.

17. The method of claim 16, wherein the switchable power source is powered off in response to a change in the retention signal, thereby causing the first latch to become inoperative.

18. The method of claim 16, wherein a voltage generated by the standby power source is scalable to reduce power consumption.

19. The method of claim 16, wherein a reduction in the leakage current drawn by the second latch from the standby power supply is approximately 450% less compared to a high performance type data retention circuit.

20. The method of claim 16, wherein a reduction in leakage current drawn by the second latch from the standby power supply is approximately 19% less compared to a reduced leakage type data retention circuit.

* * * * *